United States Patent [19]

Hsu et al.

[11] Patent Number: 5,479,609
[45] Date of Patent: * Dec. 26, 1995

[54] SOLID STATE PERIPHERAL STORAGE DEVICE HAVING REDUNDENT MAPPING MEMORY ALGORITHM

[75] Inventors: Juei-Chi Hsu, Cupertino; Fong-Long Lin, Fremont; Chi-Chung Yin, Cupertino, all of Calif.

[73] Assignee: Silicon Storage Technology, Inc., Sunnyvale, Calif.

[ * ] Notice: The portion of the term of this patent subsequent to Oct. 25, 2011, has been disclaimed.

[21] Appl. No.: 107,375

[22] Filed: Aug. 17, 1993

[51] Int. Cl.$^6$ ........................................ G06F 12/00
[52] U.S. Cl. ........................................ 395/182.06
[58] Field of Search ........................ 395/575; 371/21.6, 371/10.1, 10.2, 10.3; 364/245.3

[56] References Cited

U.S. PATENT DOCUMENTS

| | | | |
|---|---|---|---|
| 4,780,855 | 10/1988 | Iida et al. | 365/230 |
| 4,872,166 | 10/1989 | Jippo | 371/11.1 |
| 4,942,575 | 7/1990 | Earnshaw et al. | 371/10.1 |
| 4,984,149 | 1/1991 | Iwashita et al. | 364/200 |
| 4,984,151 | 1/1991 | Dujari | 364/200 |
| 5,021,944 | 6/1991 | Sasaki et al. | 365/200 |
| 5,077,737 | 12/1991 | Leger et al. | 371/10.1 |
| 5,200,959 | 4/1993 | Gross et al. | 371/21.6 |
| 5,359,570 | 10/1994 | Hsu et al. | 365/230.01 |

*Primary Examiner*—Robert W. Beausoliel, Jr.
*Assistant Examiner*—Stephen C. Elmore
*Attorney, Agent, or Firm*—Limbach & Limbach; Ronald L. Yin

[57] ABSTRACT

A solid state peripheral storage device has a mapping memory which receives a first address from a computer system and provides a mapping to a PSN data. The PSN data addresses memory units and the mapping memory unit are all made out of solid state floating gate storage cells. Through the use of the mapping memory, defective sectors in the memory units can be mapped out and fresh, unused, defective-free sectors can then be replaced, all automatically, without user intervention. Finally, in the event a portion of the mapping memory unit becomes defective, the mapping unit is then mapped by an indirect address to a different location in the memory unit where the mapping of the first address to PSN address is stored.

19 Claims, 4 Drawing Sheets

Microfiche Appendix Included
(75 Microfiche, 1 Pages)

SOLID STATE PERIPHERAL STORAGE DEVICE HAVING REDUNDENT MAPPING MEMORY ALGORITHM

This application is submitted with a microfiche appendix containing copyrighted material, Copyright 1993, Silicon Storage Technology, Inc. The appendix consists of Exhibit A: one (1) microfiche with seventy-five (75) frames.

The copyright owner has no objection to the facsimile reproduction by anyone of the patent document or the patent disclosure, as it appears in the Patent and Trademark Office patent file or records, but otherwise reserves all copyright rights whatsoever in the appendix.

TECHNICAL FIELD

The present invention relates to a peripheral storage device employing floating gate solid state storage cells as the storage medium and a redundant mapping memory algorithm. More particularly, the present invention relates to such a device and a method of operating the device.

BACKGROUND OF THE INVENTION

Peripheral devices to a computer are well known in the art. One prior art peripheral device employs magnetic medium as the storage medium. This is evidenced by hard disk drives and floppy disk drives. Hard disk drives can be erased and programmed many times. In addition, they can store a large capacity. Another type of peripheral storage device using solid state memory is the Read Only Memory (ROM). ROM's can be programmable once and read only. ROM devices have the advantage that they consume less power and have faster access time. However, unlike magnetic medium, they cannot be erased and programmed repeatedly.

More recently, as scale of integration has increased, floating gate solid state memory devices have been suggested as being useable in a peripheral storage device. Floating gate memory devices have the advantage that they can be programmed and erased, electrically, thereby, exhibiting the advantages of ROM memory, i.e., low power consumption and faster access, along with the write ability of magnetic medium. In addition, as integrated circuit fabrication scale increases, greater density can be achieved. However, one problem of using the floating gate solid state memory device is that the chip must be virtually defect free. Since the price of each memory chip is dependent upon its yield (the inverse of defect), more stringent requirement of defect free means low yield and high price per chip.

In anticipation of solid state memory storage devices proliferating, a standard, PCMCIA (Personal Computer Memory Card International Association), has been adopted to set the electrical and mechanical interface requirements between a solid state storage peripheral device and a computer system.

In U.S. application Ser. No. 07/977,697, filed on Nov. 13, 1992, a solid state peripheral storage device is disclosed. The solid state peripheral storage device disclosed in that application uses a map ROM which converts the received Logical Sector Number address from a computer and translates them into a Physical Sector Number which is an address to a solid state memory array where the electrically erasable data is stored.

SUMMARY OF THE INVENTION

In the present invention, a solid state peripheral storage device having redundant mapping memory circuit is disclosed. The device interfaces with a computer which provides a first address signal and a data signal. The device has a memory means which comprises a plurality of floating gate storage cells. The memory means has a first portion for storing the data signals supplied from the computer or for retrieving data signals stored therein to be supplied to the computer. The memory means has a second portion for storing redundantly a second address signals. The second address signals are address signals directed to locations in the first portion of the memory means. The memory means further has a third unused portion. The device further has a decoding means for receiving the data signal and for generating control signals in response thereto. The control signals control the memory means for storing a third address signal in the second portion of the memory means. The third address signal is directed to a location in the third portion of the memory means, where the second addresses are stored.

DETAILED DESCRIPTION OF THE DRAWINGS

Figure 1:
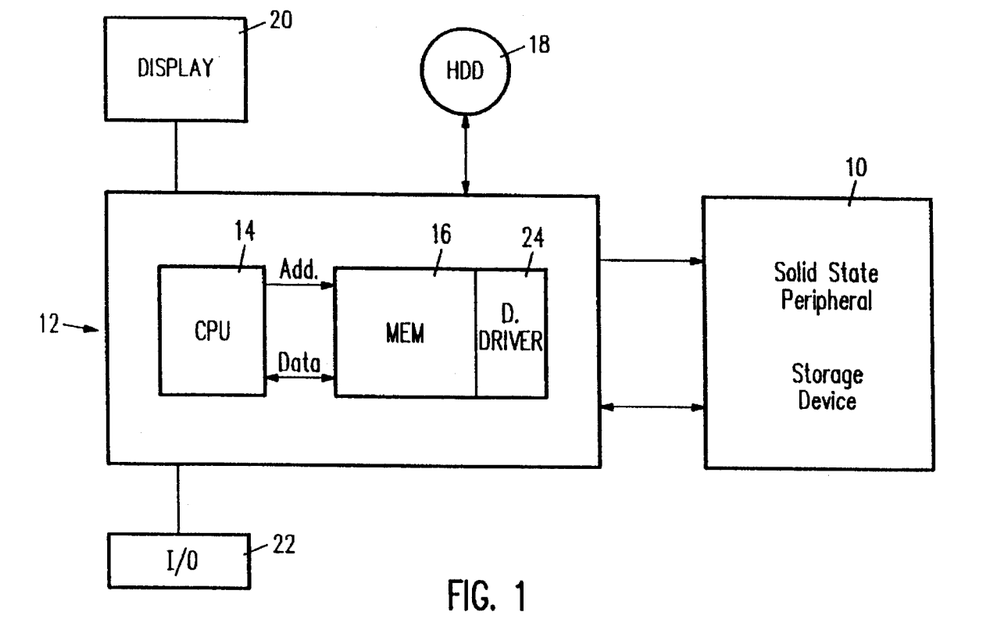
FIG. 1 is a block level diagram of a computer system with a Solid state memory storage device of the present invention.

Referring to FIG. 1 there shown a schematic block level diagram of a solid state memory storage device 10 of the present invention. The device 10 is a peripheral device for use with a computer system 12, having a central processing unit (CPU) 14 which addresses a memory 16 to store or to retrieve data therefrom. In addition, the system 12 comprises a peripheral device 18 such as a HDD (hard disk drive), a display 20, and an I/O unit 22, such as a keyboard. As is well known in the art, where the system 12 is an IBM PC compatible system operating under PC DOS or MS DOS operating system, a software called a device driver 24 must be loaded into the memory 16 to enable the CPU 14 to address the device 10, of the present invention. A copy of a device driver 24, suitable for use with an IBM PC compatible computer 12 operating PC DOS or MS DOS or other similar operating system is set forth in Exhibit A. The driver 24 can be loaded into the memory 16 from the HDD 18 or, as will be seen, even from the device 10 itself. In the preferred embodiment, the software driver 24 is a Terminate and Stay Resident (TSR) program.

Figure 2:
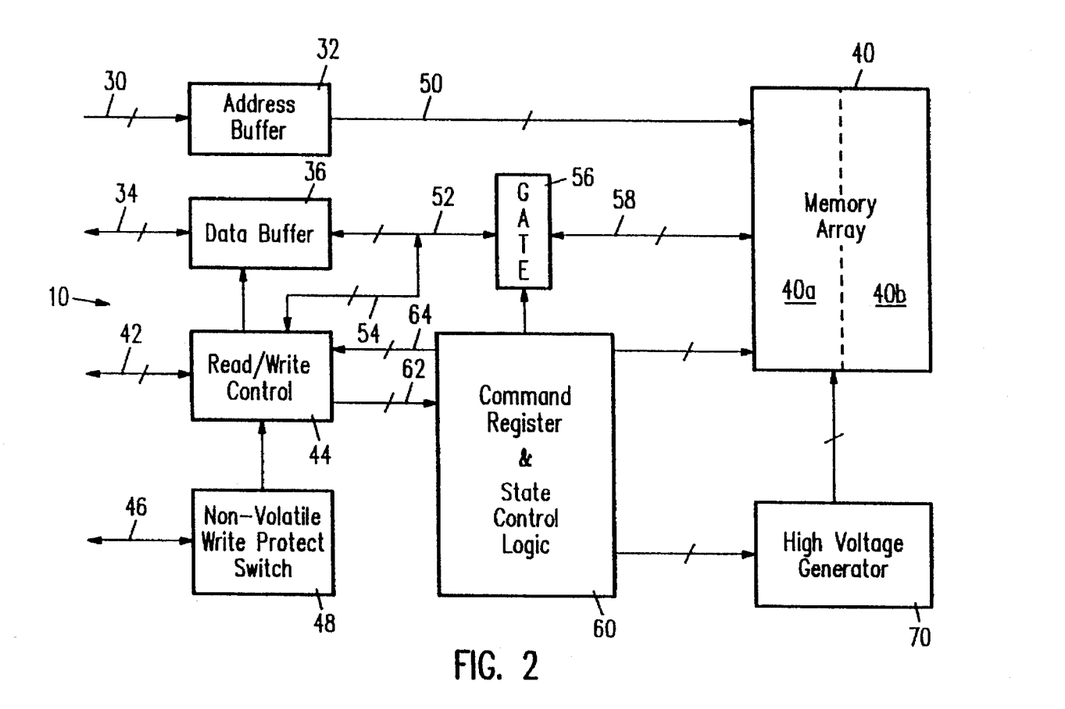
FIG. 2 is a block level diagram of the solid state memory storage device of the present invention.

Referring to FIG. 2, the device 10 receives data signals along a data bus 34 from the system 12. The data bus 34 is supplied to a data buffer 36. In the preferred embodiment, since the device 10 interfaces with an IBM PC compatible computer 12, the data bus 34 is 16 bits wide. The device 10 also receives address signals along an address bus 30 from the system 12. The address signal 30 are supplied to an address buffer 32. The width of the address bus 30 is dependant upon the size of the memory array 40. Since the device 10, in the preferred embodiment, is built in accordance with the PCMCIA standard, the address bus 30 can be a maximum of 26 bits.

The device 10 also receives read/write control signals along a read/write bus 42. The read/write control signals 42 are supplied to a read/write control logic 44, which will be explained in greater detail hereinafter.

The device 10 also receives a write protect signal 46. The write protect signal 46 is supplied to a non-volatile write protect switch 48. Finally, the device 10 receives a plurality of other control signals. As previously discussed, the device 10 in the preferred embodiment, operates in accordance with the PCMCIA standard. The following is a list of the pins and the signals interfacing the device 10 with the computer system 12 in accordance with the PCMCIA standard.

| Pin # | Signal | I/O | Function |
|---|---|---|---|
| 1 | GND | | Ground |
| 2 | $D_3$ | I/O | Data bit 3 |
| 3 | $D_4$ | I/O | Data bit 4 |
| 4 | $D_5$ | I/O | Data bit 5 |
| 5 | $D_6$ | I/O | Data bit 6 |
| 6 | $D_7$ | I/O | Data bit 7 |
| 7 | $CE_1$ | I | Card Enable |
| 8 | $A_{10}$ | I | Address input bit 10 |
| 9 | $\overline{OE}$ | I | Output Enable |
| 10 | $A_{11}$ | I | Address input bit 11 |
| 11 | $A_9$ | I | Address input bit 9 |
| 12 | $A_8$ | I | Address input bit 8 |
| 13 | $A_{13}$ | I | Address input bit 13 |
| 14 | $A_{14}$ | I | Address input bit 14 |
| 15 | $\overline{WE}$ | I | Write Enable |
| 16 | NC | | No Connect |
| 17 | $V_{CC}$ | | Power Supply (5V ± 10%) |
| 18 | NC | | No Connect |
| 19 | $A_{16}$ | I | Address input bit 16 |
| 20 | $A_{15}$ | I | Address input bit 15 |
| 21 | $A_{12}$ | I | Address input bit 12 |
| 22 | $A_7$ | I | Address input bit 7 |
| 23 | $A_6$ | I | Address input bit 6 |
| 24 | $A_5$ | I | Address input bit 5 |
| 25 | $A_4$ | I | Address input bit 4 |
| 26 | $A_3$ | I | Address input bit 3 |
| 27 | $A_2$ | I | Address input bit 2 |
| 28 | $A_1$ | I | Address input bit 1 |
| 29 | $A_0$ | I | Address input bit 0 |
| 30 | $D_0$ | I/O | Data input/output bit 0 |
| 31 | $D_1$ | I/O | Data input/output bit 1 |
| 32 | $D_2$ | I/O | Data input/output bit 2 |
| 33 | WP | I/O | Write Protect |
| 34 | GND | | Ground |
| 35 | GND | | Ground |
| 36 | $\overline{CD_2}$ | O | Card Detect |

-continued

| Pin # | Signal | I/O | Function |
|---|---|---|---|
| 37 | $D_{11}$ | I/O | Data bit 11 |
| 38 | $D_{12}$ | I/O | Data bit 12 |
| 39 | $D_{13}$ | I/O | Data bit 13 |
| 40 | $D_{14}$ | I/O | Data bit 14 |
| 41 | $D_{15}$ | I/O | Data bit 15 |
| 42 | $\overline{CE_2}$ | I | Card Enable 2 |
| 43 | N/C | | No Connect |
| 44 | N/C | | No Connect |
| 45 | N/C | | No Connect |
| 46 | $A_{17}$ | I | Address input bit 17 |
| 47 | $A_{18}$ | I | Address input bit 18 |
| 48 | $A_{19}$ | I | Address input bit 19 |
| 49 | $A_{20}$ | I | Address input bit 20 |
| 50 | $A_{21}$ | I | Address input bit 21 |
| 51 | $V_{CC}$ | | Power Supply (5V ± 10%) |
| 52 | N/C | | No Connect |
| 53 | $A_{22}$ | I | Address input bit 22 |
| 54 | $A_{23}$ | | Address input bit 23 |
| 55 | $A_{24}$ | | Address input bit 24 |
| 56 | $A_{25}$ | | Address input bit 25 |
| 57 | N/C | | No Connect |
| 58 | N/C | | No Connect |
| 59 | N/C | | No Connect |
| 60 | N/C | | No Connect |
| 61 | $\overline{REG}$ | I | Register Select |
| 62 | $BVD_2$ | O | Battery Voltage Detect 2 |
| 63 | $BVD_1$ | O | Battery Voltage Detect 1 |
| 64 | $D_8$ | I/O | Data bit 8 |
| 65 | $D_9$ | I/O | Data bit 9 |
| 66 | $D_{10}$ | I/O | Data bit 10 |
| 67 | $\overline{CD_2}$ | O | Card Detect |
| 68 | GND | | Ground |

In accordance with the PCMCIA standard, pins 1–34 are on one side of the PCMCIA card with pins 35–68 on the back side of the PCMCIA card.

The address signals from the address bus 30 are loaded or stored in the address buffer 32 which consists of a plurality of registers. The signals stored in the address buffer 32 are then supplied to an internal address bus 50. The internal address 50 is directed to the memory array 40. The memory 40 array is an array comprising a plurality of floating gate storage cells of the type shown and disclosed in U.S. Pat. Nos. 5,067,108 or 5,029,130 or Ser. No. 07/682,459 filed on Apr. 9, 1991, incorporated herein by reference.

The data signals supplied on the data bus 34 are supplied to a data buffer 36 which is simply a plurality of registers and stores the data signals. From the data buffer 36, the data signals are supplied along a first internal data bus 52 which is supplied to a gate 56. The gate 56 is controlled by a command register and state controller logic unit 60. From the gate 56, the data signals are then supplied to a second internal data bus 58 which is then supplied to the memory array 40. The signals along the first internal data bus 52 are also supplied to a third internal data bus 54 which is supplied to the read/write control unit 44. In addition, as previously stated, the read/write control unit 44 receives read/write control signals supplied along the read/write bus 42. The read/write control unit 44 controls the data buffer 36. In addition, the read/write control unit 44 supplies data to the command register and state control logic 60 along the bus 62 and receives data from the command register 60 along the bus 64.

The write protect signal 46 is supplied to the non-volatile write protect switch 48 which operates in accordance with that disclosed in U.S. Pat. No. 5,226,006, which is incorporated herein by reference. The non-volatile write protect switch 48 controls the read/write control unit 44.

Finally, the device 10 comprises a high voltage generator 70 which generates high voltage signals used during the write operation and are supplied to the memory array 40. The command register and state control logic 60 generates the control signals for the memory array 40 and for the high voltage generator 70.

Figure 3:
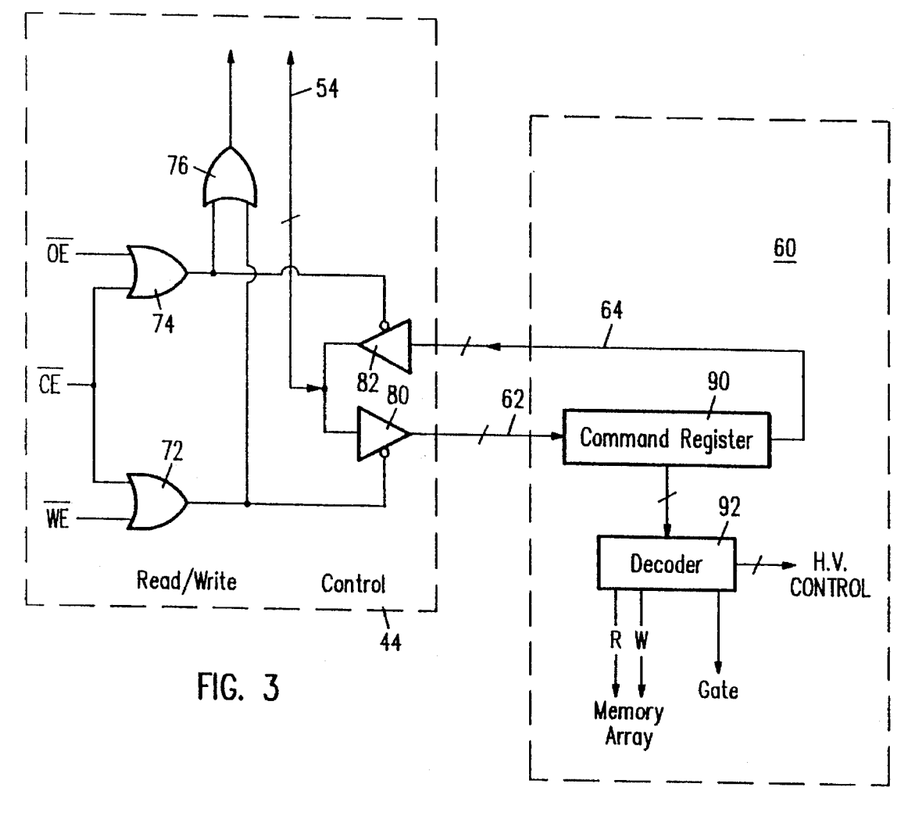
FIG. 3 is a detailed block level diagram of a portion of the read/write control and the command register and state control logic portion of the memory storage device shown in FIG. 2.

Referring to FIG. 3, there is shown in greater detail a portion of the read/write control unit 44 and the command register and state control logic 60. The read/write control signals 42, supplied to the read/write control unit 44, include the Output Enable $\overline{OE}$ signal, the Write Enable $\overline{WE}$ signal, and the Chip Enable $\overline{CE}$ signal. The Chip Enable $\overline{CE}$ signal and the Write Enable $\overline{WE}$ signals are supplied to a first OR gate 72. The Chip Enable $\overline{CE}$ signal and the Output Enable $\overline{OE}$ signal are supplied to a second OR gate 74. The output of the first OR gate 72 and the second gate OR 74 are supplied to a third OR gate 76 which provides an output signal. The output of the third OR gate 76 is supplied to the data buffer 36 to load the data buffer 36 with data either supplied from the data bus 34 or the internal data bus 52.

The output of the first OR gate 72 is also used to control a first tri-state buffer 80 which passes the signals from the bus 54 to the bus 62 to be loaded into the command register 90. In addition, the data from the command register 90 is supplied along the bus 64 back to a second tri-state buffer 82 which is controlled by the output of the second OR gate 74. The output of the second tri-state buffer 82 is connected to the internal bus 54. Therefore, in this manner the output of the first OR gate 72 or the output of the second OR gate 74 controls either the loading of the data signals from the bus 54 into the command register 90 or the supplying of the data signals from the command register 90 to the internal bus 54.

The command register and state control logic 60 comprises the command register 90, as described heretofore. The command register 90 is simply a register. The command register 90 is supplied to a decoder 92 which supplies the control signals that are supplied to the high voltage generator 70, the read or the write control signal for the memory array 40, and the signal to control the gate 56.

Figure 4:
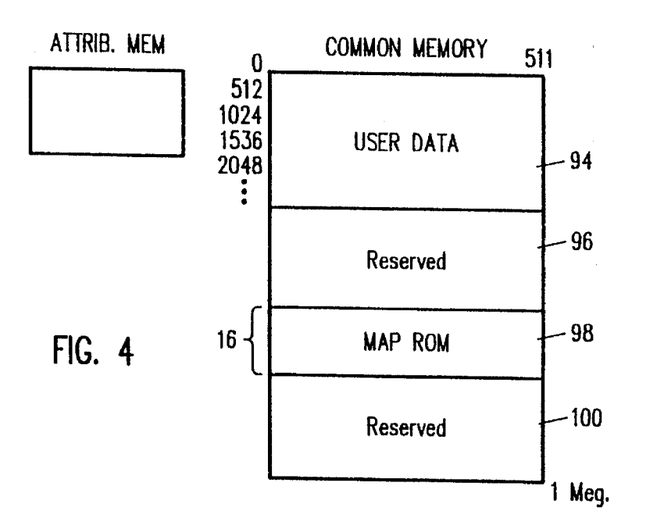
FIG. 4 is an address map showing an attribute memory and a common memory with various different types of signals stored therein.

Referring to FIG. 4 there is shown an address map of the memory array 40 of the device 10. In accordance with PCMCIA standard, the memory array 40 comprises two sections of memory: an attribute memory and a common memory. The attribute memory shares the same address space as a portion of the common memory. In accordance with PCMCIA standard, the attribute memory is addressed when the control signal $\overline{REG}$ is low and the common memory space is addressed when the control signal $\overline{REG}$ is high. The attribute memory contains data that is necessary to support PCMCIA standard as well as manufacturing defect data. All of this is in accordance with PCMCIA standard.

The common memory comprises blocks of memory in contiguous address space from 0000 to 1,2,4 or 8 megabytes, depending upon the configuration of the array 40. The memory array 40 is divided into blocks of 512 bytes with each 512 bytes being denoted as a sector. Furthermore, the array 40 is physically comprised of two memory sections. Thus, each sector of 512 bytes is composed of 256 bytes from one row (hereinafter: "LEFT") and another 256 bytes from the other row (hereinafter: "RIGHT"). In the preferred embodiment, the 256 bytes from the LEFT row are stored in a physical chip 40*a* different from the 256 bytes from the RIGHT row stored in a physical chip 40*b*. For purposes of discussion of the present invention only, we shall assume that the device 10 has 1 megabyte of addressable space in the common memory.

Referring to FIG. 4 there is shown in greater detail the memory address space of the common memory array 40. The memory array 40 is divided into four contiguous portions commencing with the lowest address space: a user data portion 94, a first reserved portion 96, a map ROM portion 98, and a second reserved portion 100. Although a first and a second reserved portion 96 and 100 are shown, clearly, they can be contiguous in space and form one single reserve portion. The first reserved portion 96 is reserved to store user data in the event portions of the memory space in the user data portion 94 become defective. The second portion 100 serves to replace portions of the map ROM 98 which become defective.

If we assume at the outset that there are no defective floating gate storage cells in the memory array 40 and if we assume that the memory array 40 is 1 megabytes in capacity, then at the outset the map ROM portion 98 contains 16 sectors of addresses. Each sector being 512 bytes is divided into 128 mapping entries with each mapping entry being 2 bytes, and redundantly stored in pairs. Thus, each mapping entry requires 4 bytes of storage. With one (1) MBytes of the array 40, it means there are only 2K sectors. 16 sectors in the map ROM portion 98 filled with address locations, and with each sector in the map ROM portion 98 having 128 entries it means that there are a total of 16×128 or 2048 entries. With 2048 entries to each entry being 512 bytes, means that the entire 1 MByte of the memory array 40 can be addressed. The storage of the entries in the map ROM portion 98, as previously described, is done redundantly and is by paired entries. This will be discussed in greater detail.

Figure 5:
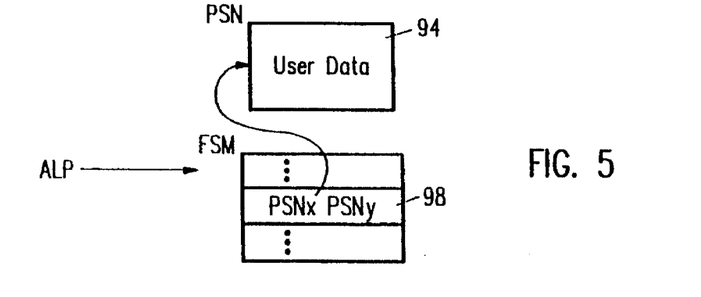
FIG. 5 is an address map of a portion of the common memory space shown in FIG. 4 of the mapping of the Address Location of where Physical Sector Number (PSN) is stored (hereinafter referred to as: ALP signal supplied from the computer to the PSN supplied from the map ROM portion of the common memory array.

Referring to FIG. 5, there is shown a normal operation of the addressing of the device 10. In the operation of the device 10 where the device 10 operates with an IBM PC compatible computer 12, the system 12 communicates with the device 10 through address sectors. Thus, the computer 12 supplies Logic Sector Number as the address to identify a particular sector location within the device 10 and more particularly within the memory array 40 of the device 10. The device 10 then converts the LSN address into a Physical Section Number (PSN) address to locate the address in the memory array 40 where the data is to be retrieved or the date from the system 12 is to be written into.

Read Operation

In the operation of device 10, if we assume that an application software desires to read data from the device 10, the application program would issue an interrupt to the DOS operating system. As well known in the convention of DOS operating system, the DOS operating system determines through the File Allocation Table (FAT) in the memory of the computer, the particular Logical Sector Number (LSN) associated with the file of interest in the device 10.

The LSN address is then supplied to the TSR program of the present invention, as set forth in Exhibit A. The TSR program of Exhibit A, would calculate the starting address of the sector in the map ROM portion 98 where the particular PSN is stored. The calculation is performed on LSN, and the FIRST MAP ROM SECTOR (FSM) as follows:

Starting Address of Sector (SAS) $= (LSN/128 + FSM) * 512$

In one embodiment, FSM is 507.

To calculate the particular entry within the sector whose beginning address is calculated above, the SAS is added by an offset equal to:

Address

Location of = SAS + (LSN Modulus 128) * 4
Where PSN
Is Stored (ALP)

The TSR program then causes the address signal ALP to be sent along the address bus 30. An address signal on the address bus 30, with an accompanying read signal on the read/write control bus 42 would cause the device 10 to read data from the memory array 40. The PSN signal stored at the ALP address (4 bytes) is then read out of the memory array 40 and sent back to the computer 14.

Subsequently, the TSR program uses the PSN address to address the device 10 again in its memory array to find the data stored therein. The physical address is calculated as follows:

Address of Data=PSN * 512

Write Operation

Similarly, in a write operation, the system 12 transfers an ALP address along the bus 30 to be stored in the address buffer 32. The PSN address is retrieved from the map ROM portion 98. Thereafter, the system 12 issues a WRITE command along the data signal 34 which is stored in the data buffer 36. The first signals on the bus 34 constitute a command rather than data. The write command in the data buffer 36 is passed from the data buffer 36 through the bus 54 to the command register 90. The command from the register 90 is decoded by the decoder 92 with the write signal issued to the memory array 40, the signal to control the gate 56 issued by the decoder 92 and the high voltage control signals being supplied to the high voltage generator 70. After the write command, the system 12 transfers a sector of data from its memory 16 into the data bus 36. Data is then written into the user data portion 94 based upon the PSN address.

Error Correction

Because the storage cells of the memory array 40 are of the floating gate type, errors in the storage cell can result from the charges on the floating gate decaying. This decay process can be divided into two stages. First, the charges stored on the floating gate can decay somewhat but still retain a charge, although it takes longer using the sense amplifier to determine whether it is a stored "1" or "0". In another stage of decay, the charges on the floating gate have decayed to a level where it has permanently changed the state of the storage cell from a "charged" to a "discharged"

To correct errors of the first type, the device 10 offers two modes of read operation: a normal read and a slow mode read. In a normal mode read, if the data read from the memory array 40 still results in data error, then the same address is read again in a slow mode. The slow mode read would cause the sense amplifiers to be turned on longer permitting the lower amount of charge stored on the floating gate to differentiate the charge level between a "1" or a "0".

As for the errors of the second type, each sector of data is written into the memory array 40 with its associated error correction code (ECC). In one embodiment, the ECC is a Reed-Solomon code which applies 88 bits for each sector of data. In another embodiment, the ECC for a sector of data is encoded with CRC error detection. Finally, as will be shown, another embodiment of ECC is the use of redundant Hamming code.

Since each sector of data is written into the memory array 40 with its associated ECC code, and since it is possible to detect under certain circumstances when the error has arisen, the device 10 can operate on the data to correct the error. The error correction can be one of three following methods.

1. In the first method, data from the memory array 40 is read in the normal mode. If the error persists, the data from that sector is re-read in a slow mode.

2. In a second method, the sector data is first read in the normal mode. If error persists, this is followed by attempted correction on the sector of data using ECC correction scheme. Thereafter, if error persists, then the same sector of data is read in the slow mode with ECC applied thereto.

3. Finally, in yet another method of error correction, the data is first read in a normal mode. If error persists, this is followed by a re-read of the sector data in the slow mode. If error persists, the data in the just read slow mode is operated upon by an ECC unit to correct the error therein. Finally, if error still persists, then the data from the sector is read again in the normal mode with the ECC correction applied thereto.

Apart from error correction of the data, since the memory array 40 has portions of it written more frequently than other portions, different error recovery schemes are used to protect different portions.

Since the user data portion 94 is retrieved frequently and is written to frequently, sectors within the data portion 94 can fail. Thus, the first reserved portion 96 is used to replace the sectors that have failed in the user data portion 94. In the event of failure of the data in the user data portion 94, fresh unused sectors of the storage cells from the first portion 96 are then used to store the data from the user data portion 94.

Similarly, the storage cells in the map ROM portion 98 can also fail due to their being retrieved and written into frequently. As previously discussed, each entry in the map ROM portion 98 is stored redundantly. Each entry consists of two 16 bit PSN address pointing to the location of the sector within the data user portion 94. However, the two 16 bit entries are stored in alternating nibbles in the following format:

| Row | RIGHT | LEFT | RIGHT | LEFT | RIGHT | LEFT | RIGHT | LEFT |
|---|---|---|---|---|---|---|---|---|
| Bit | 31:28 | 27:24 | 23:20 | 19:16 | 15:12 | 11:8 | 7:4 | 3:0 | state. In this case, a permanent data error has occurred.

The underlying assumption of storing mapping entries redundantly and in alternating nibbles is that the two entries will not fail on the same programing cycle, even though the two entries and in fact the entire sector is always programmed at the same time, because the two sectors are stored in two physically different chips.

Figure 6:
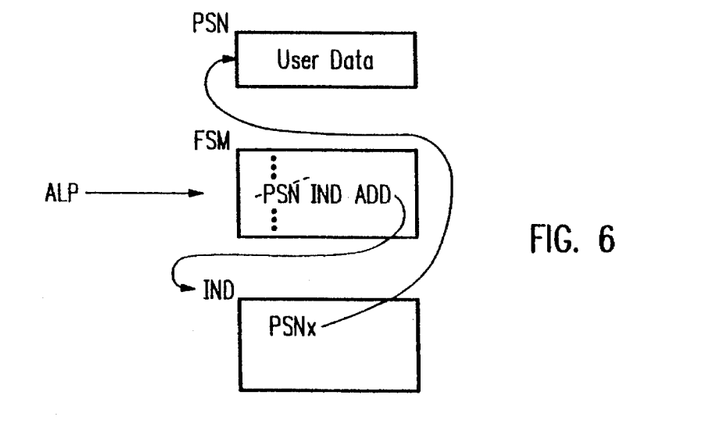
FIG. 6 is an address map of the common memory array with the present invention wherein the ALP address signals supplied from the computer are mapped to an indirect address signal, stored in the map ROM portion, and which directs to a third portion of the common memory array where the PSN address signals are mapped to the user data signal portion of the memory array.

In the event one of the mapping entries in one of the sectors in the map ROM portion 98 fails, then that entire sector of data in the map ROM portion 98 is written into one of the sectors from the second reserved portion 100. In other words, a new, fresh, unused sector from the second reserve portion 100 is used to store data from the entire sector of mapping entries from the map ROM portion 98 which had failed. The mapping entries stored in the reserved portion 100 is identical to the sector when it was previously stored, in the map ROM 98, i.e. the mapping entries are stored redundantly.

As for what is stored in the sector from the mapping ROM 98 which had the defective mapping entry, an analysis is first made to determine which of the two rows (LEFT or RIGHT) had failed. In the event the LEFT row failed, then an indirect address data is written into each of the mapping entries in the RIGHT row in the sector within the map ROM 98 that failed. Thus, all of the mapping entries in the RIGHT row of the sector contain the identical indirect address. The indirect address is an address to the starting address of the fresh replacement sector from the second reserve portion 100. As for the LEFT row which had failed, an attempt would be made to set each of the mapping entries of the LEFT row to an illegal sector address. By illegal address it is meant an address which is pointing to a non-existing area of the memory array 40. If however, the failed mapping entry(s) cannot be forced into an illegal entry, then nothing is done.

Thereafter, when the computer 12 issues an ALP address, the ALP address again points to a mapping entry (4 bytes) in a sector within the map ROM 98. The mapping entry in the sector addressed in the map ROM 98 is read out and is supplied to the computer 12. The program, set forth in Exhibit A examines the contents of the LEFT row and the RIGHT row of the mapping entry. If they do not match, then the program knows that this is an indirect address. Otherwise, it is assumed to be a direct address and the method described and shown in FIG. 5 is utilized.

To link to the replacement sector from the second reserved portion 100, the program reads the mapping entries that immediately surround the targeted mapping entry. In the preferred embodiment, two mapping entries which precede the target mapping entry and the two mapping entries which succeed the target mapping entries are also read. Both the LEFT and RIGHT rows of each of the five read out mapping entries are examined. The program set forth in Exhibit A then preforms a calculation. If at least three of the entries in the same row (LEFT or RIGHT) are equal and is a legal address, and three or more entries in the opposite row (RIGHT or LEFT) are the same and point to an illegal address, then the legal address is used. However, if the program is unable to determine the legal address based upon this criteria then an addition five consecutive mapping entries are read and the test is performed again. The program has to go through this analysis, because based upon the mis-match alone between the RIGHT row and the LEFT row, one cannot determine which is the illegal address and which is the indirect address. The failed mapping entry might still be a legal address because it could not be forced into an illegal address.

Figure 8:
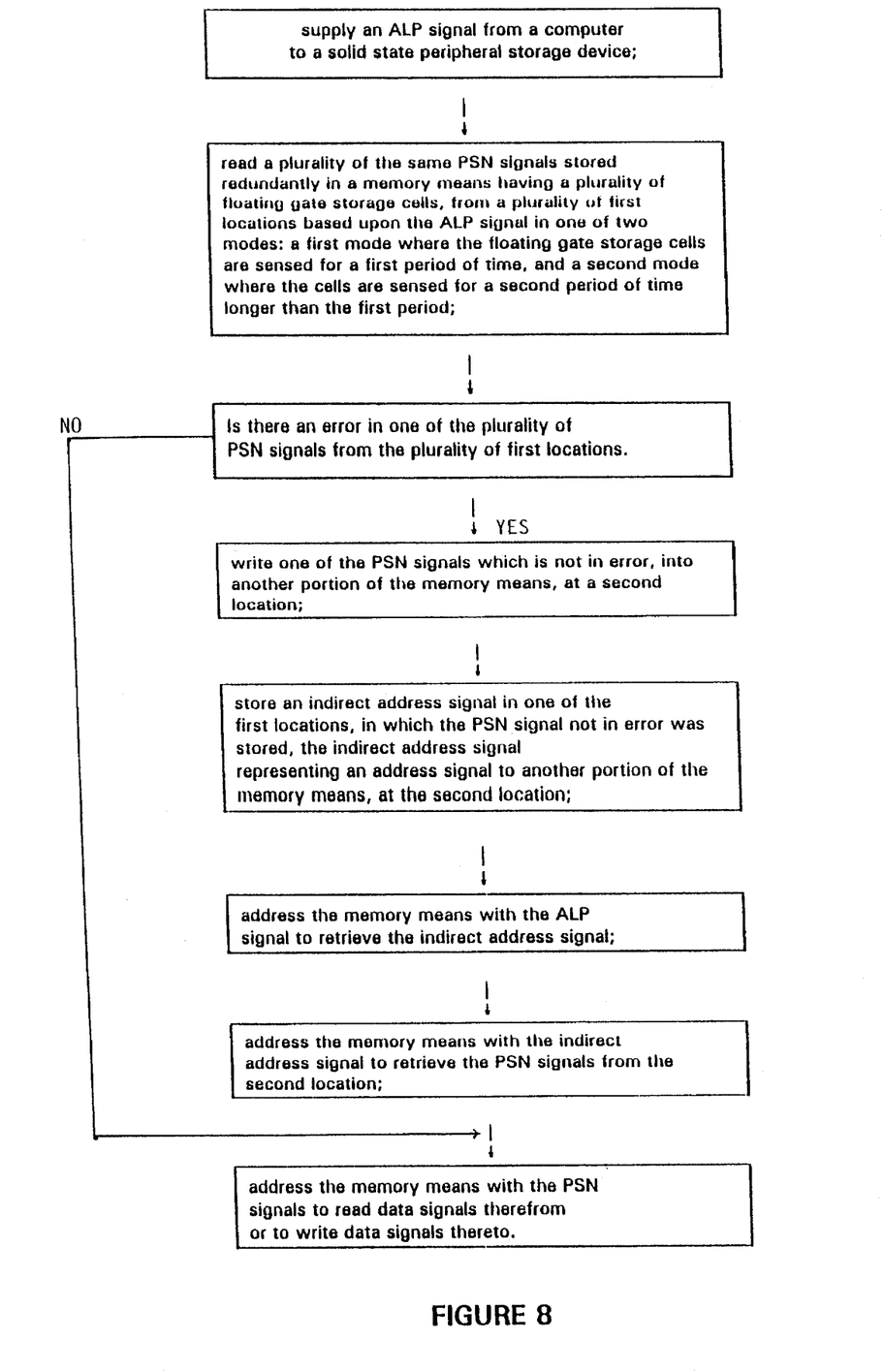
FIG. 8 is a flow chart showing the method of operating the device of the present invention.

With the legal address read, it is then used to direct towards the starting address of the replacement sector which is in the second reserved portion 100. The particular entry in the replacement sector is determine by dividing the indirect address by 128 and finding the remainder and using that as the mapping entry within the replacement sector, all as previously described. The PSN from the mapping entry in the replacement sector is then used as an address to the user data portion 94. A flow chart showing the operation is set forth in FIG. 8.

Self Booting Storage Device

Figure 7:
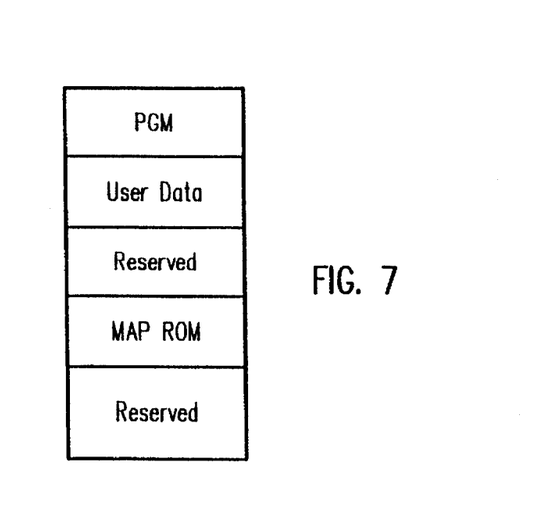
FIG. 7 is an address map of a common memory array of a self booting memory storage device.

As previously discussed, in the device 10 of the present invention, it is used for the system 12 operating with the device 24 in its memory 16. The device driver 24 is typically loaded from a hard disk drive 18 or some other type of peripheral device. Referring to FIG. 7 there is shown an address mapping space of the memory array 40 of yet another device 10. In this address space, the device driver 24 or the program is stored in the memory array 40 in the lowest address. Thus, upon start up, the program from the memory array 40 is loaded directly into the memory 16 of the system 12.

There are many advantages to the device 10 of the present invention and the method of its operation. As can be seen, because of the unique nature of redundant mapping, the map ROM can be a portion of the memory array 40 and through usage can become defective and can be mapped out without any loss or any penalty. Furthermore, as the storage cells are used and as they degrade in performance, various recovery schemes are provided automatically so that to the user, the device 10 remains as defective free as when originally first used.

What is claimed is:

1. A solid state peripheral storage device for interfacing with a computer providing a first address signal; said solid state peripheral storage device comprising:

memory means comprising a plurality of floating gate storage cells and having
a first portion for storing a data signal supplied from the computer or for retrieving a stored data signal stored therein to be supplied to the computer;
a second portion for storing a plurality of second address signals, wherein each of said plurality of second address signals is stored in duplicate in said second portion, said plurality of second address signals representing locations in said first portion of said memory means;
a third portion; and
decoding means for receiving the data signal and for generating a control signal in response thereto; said control signal for controlling the memory means for storing a third address signal in the second portion, said third address signal representing locations in said third portion of said memory means; and for storing one of said plurality of second address signals, previously stored in the second portion replaced by the third address signal in said third portion addressed by the third address signal.

2. The solid state peripheral storage device of claim 1 wherein each of said plurality of second address signals comprises a plurality of nibbles, and each of said plurality of second address signals is stored in alternating nibbles with a duplicate of each of said plurality of second address signals stored between alternating nibbles.

3. The solid state peripheral storage device of claim 1 wherein said second portion comprises two physically different memory means, each for storing said plurality of second address signals.

4. The solid state peripheral storage device of claim 1 further comprises:

means for reading the stored data signals from said memory means in two modes: wherein in a first mode each of said plurality of floating gate storage cells of said first portion addressed by one of said plurality of second address signals, is sensed for a first period of time, and wherein in a second mode each of said plurality of floating gate storage cells of said first portion addressed by said one of said plurality of second address signals is sensed for a second period of time, with said first period longer than said second period.

5. The solid state peripheral storage device of claim 1 wherein said memory means further having a fourth portion for storing a program for execution by the computer to provide the data signal to cause the decoding means to generate the control signal in response thereto.

6. A computer system having a computer with a solid state peripheral storage device with the computer providing a first address signal, and a data signal to the solid state peripheral storage device, said computer system comprising:

a first memory means in the solid state peripheral storage device for storing the data signal from the computer, said first memory means comprising a plurality of floating gate storage cells;

a second memory means in the solid state peripheral storage device for storing a plurality of second address signals, each of said plurality of second address signals is stored in duplicate in said second memory means, with one of said plurality of second address signals stored at a first location and with a duplicate of said one of said plurality of second address signals stored at a corresponding first location, each of said plurality of second address signals representing an address signal to the first memory means, said second memory means comprising a plurality of floating gate storage cells;

a third memory means comprising a plurality of floating gate storage cells;

said computer executing a program having means for addressing the second memory means based upon the first address signal, and to retrieve said one of said plurality of second address signals from said first location and said duplicate of said one of said plurality of second address signals from said corresponding first location and to address the first memory means in response thereto; and said computer executing the program further having means for detecting defects in the second memory means at said first location; and for changing the second memory means at said corresponding first location to store an indirect address signal; said indirect address signal addressing a second location in the third memory means; and for storing the one of said plurality of second address signals from the corresponding first location in the third memory means, at said second location.

7. The computer system of claim 6 wherein said one of said plurality of said second address signals comprises a plurality of nibbles and are stored in alternating nibbles with said duplicate of said one of said plurality of second address signals stored between alternating nibbles.

8. The computer system of claim 6 wherein said second memory means comprises two physically different memory chips for storing said plurality of second address signals, with one memory chip for storing said plurality of second address signals, and another memory chip for storing said duplicate of said plurality of second address signals.

9. The computer system of claim 6 further comprising:

means for reading the data signal from the first memory means in two modes: wherein in a first mode each of said plurality of floating gate storage cells addressed by each of said plurality of second address signals is sensed for a first period of time, and wherein in a second mode each of said plurality of floating gate storage cells addressed by said each of said one of said plurality of second address signals is sensed for a second period of time, with said first period longer than said second period.

10. The computer system of claim 6 further comprising:

a fourth memory means for storing the program for execution by the computer.

11. A computer system having a computer with a solid state peripheral storage device with the computer providing a first address signal and a data signal to the solid state peripheral storage device, said computer system comprising:

memory means in the solid state peripheral storage device comprising a plurality of floating gate storage cells and having a first portion for storing the data signal from the computer; or for retrieving data signal stored therein to be supplied to the computer;

a second portion for storing a plurality of second address signals, wherein each of said plurality of second address signals is stored in duplicate in said second portion, with each of said plurality of second address signals stored at a location and with a duplicate of said each of said plurality of second address signals stored at a corresponding location, said plurality of second address signals representing address signals to the first portion of the memory means;

a third portion;

said computer executing a program having means for addressing the second portion of the memory means based upon the first address signal, and to retrieve one of said plurality of second address signals therefrom and to address the first portion of the memory means based upon the one of said plurality of second address signals retrieved from the second portion; and said computer executing a program further having means for detecting one or more defects in the second portion of the memory means at a first location addressed by the first address signal; and for changing the second portion of the memory means at a corresponding first location to store an indirect address signal; said indirect address signal addressing a second location in the third portion of the memory means; and for storing the one of said plurality of second address signals from the corresponding first location, at said second location.

12. The computer system of claim 11 wherein each of said plurality of second address signals comprises a plurality of nibbles, and each of said plurality of second address signals is stored in alternating nibbles, with a duplicate of each of said plurality of second address signals stored between alternating nibbles.

13. The computer system of claim 11 further comprising:

means for reading the data signal from the first portion in two modes: wherein in a first mode each of said plurality of floating gate storage cells addressed by said one of said plurality of second address signals is sensed for a first period of time, and wherein in a second mode each of said plurality of floating gate storage cells addressed by said one of said plurality of second address signals is sensed for a second period of time, with said first period of time longer than said second period of time.

14. The computer system of claim 11 further comprising:

a fourth portion for storing the program for execution by the computer.

15. A method of reading data signals from or writing data signals to a solid state peripheral storage device connected to a computer, said method comprising:

supplying a first address signal from the computer to the solid state peripheral storage device;

reading a plurality of second address signals stored in a memory means having a plurality of floating gate storage cells, from a plurality of first locations based upon the first address signal;

determining if one of said plurality of second address signals from said plurality of first locations is in error; and in an event of an error;

writing one of said plurality of second address signals, from one of said plurality of first locations which is not in error, into another portion of the memory means, at a second location;

writing an indirect address signal into said one of said plurality of first locations, said indirect address signal representing an address signal to said another portion of the memory means, at said second location;

addressing said memory means with said first address signal to retrieve said indirect address signal;

addressing said memory means with said indirect address signal to retrieve said one of said plurality of second address signals; and addressing said memory means with said one of said plurality of second address signals to read data signals therefrom or to write data signals thereto.

16. The method of claim 15 wherein said plurality of second address signals is a sector of a pair of redundant physical sector signals.

17. The method of claim 16 wherein each of the pair of redundant physical sector signals, which is not in error, is replaced by the indirect address signal.

18. The method of claim 17 wherein said indirect address signal is an address signal to another portion of the memory means comprising a sector of a pair of redundant second address signals.

19. The method of claim 15 wherein said memory means is a pair of physically different chips each for storing identical plurality of second address signals.

* * * * *